(12) United States Patent
Ananthan et al.

(10) Patent No.: US 8,981,335 B2
(45) Date of Patent: Mar. 17, 2015

(54) ZNTE ON TIN OR PT ELECTRODES WITH A PORTION OPERABLE AS A CURRENT LIMITING LAYER FOR RERAM APPLICATIONS

(71) Applicant: Intermolecular, Inc., San Jose, CA (US)

(72) Inventors: Venkat Ananthan, Cupertino, CA (US); Prashant B. Phatak, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/073,718

(22) Filed: Nov. 6, 2013

(65) Prior Publication Data

US 2014/0264241 A1    Sep. 18, 2014

Related U.S. Application Data

(60) Provisional application No. 61/785,069, filed on Mar. 14, 2013.

(51) Int. Cl.
| | |
|---|---|
| *H01L 47/00* | (2006.01) |
| *G11C 13/00* | (2006.01) |
| *H01L 45/00* | (2006.01) |
| *H01L 21/66* | (2006.01) |
| *H01L 27/24* | (2006.01) |

(52) U.S. Cl.
CPC ............ *G11C 13/0069* (2013.01); *H01L 45/12* (2013.01); *H01L 45/16* (2013.01); *H01L 45/1253* (2013.01); *H01L 45/144* (2013.01); *H01L 45/1616* (2013.01); *H01L 22/12* (2013.01); *G11C 13/0002* (2013.01); *G11C 13/0007* (2013.01); *G11C 2013/0083* (2013.01); *G11C 2213/15* (2013.01); *G11C 2213/71* (2013.01); *G11C 2213/77* (2013.01); *H01L 2924/0002* (2013.01); *H01L 45/08* (2013.01); *H01L 45/1233* (2013.01); *H01L 45/1266* (2013.01); *H01L 45/145* (2013.01); *H01L 27/2463* (2013.01)
USPC .............................................. 257/4; 438/382

(58) Field of Classification Search
CPC ....................................................... H01L 45/00
USPC ............................................... 257/4; 438/382
See application file for complete search history.

(56) References Cited

U.S. PATENT DOCUMENTS

| | | | |
|---|---|---|---|
| 2011/0175049 A1* | 7/2011 | Yasuda et al. | 257/3 |
| 2012/0008370 A1* | 1/2012 | Yasuda et al. | 365/148 |
| 2012/0025386 A1* | 2/2012 | Murata | 257/770 |
| 2012/0061638 A1* | 3/2012 | Kunikiyo et al. | 257/1 |

(Continued)

OTHER PUBLICATIONS

Burgelman; A ZnTe Thin Film Memory Device; 1980; Gordon and Breach Science Publishers, Inc.; Electrocomponent Science and Technology, vol. 7, pp. 93-96.

(Continued)

*Primary Examiner* — Caleb Henry

(57) ABSTRACT

Resistive random access memory (ReRAM) cells can include a ZnTe switching layer and TiN or Pt electrodes. The combination of the switching layer of ZnTe and the electrodes of TiN or Pt is designed to achieve desirable performance characteristics, such as low current leakage as well as low and consistent switching currents. High temperature anneal of the ZnTe switching layer can further improve the performance of the ReRAM cells. The switching layer may be deposited using various techniques, such as sputtering or atomic layer deposition (ALD).

20 Claims, 8 Drawing Sheets

(56) References Cited

U.S. PATENT DOCUMENTS

| | | | |
|---|---|---|---|
| 2012/0068146 A1* | 3/2012 | Hattori et al. | 257/4 |
| 2012/0145987 A1* | 6/2012 | Sei et al. | 257/5 |
| 2012/0147656 A1* | 6/2012 | Sone | 365/148 |
| 2012/0218808 A1* | 8/2012 | Yasuda et al. | 365/148 |
| 2012/0236625 A1* | 9/2012 | Ohba et al. | 365/148 |
| 2013/0001496 A1* | 1/2013 | Shimuta et al. | 257/2 |
| 2013/0001497 A1* | 1/2013 | Ohba et al. | 257/2 |
| 2013/0021834 A1* | 1/2013 | Koyama | 365/148 |

OTHER PUBLICATIONS

Hossain et al.; DC Conduction and Switching Mechanisms in Electroformed Al/ZnTe: V/Cu Devices at Atmospheric Pressure; Department of Physics, Rajshahi University of Engineering and Technology; pp. 1-7.

\* cited by examiner

Initial Forming

Operational Switching

ZNTE ON TIN OR PT ELECTODES WITH A PORTION OPERABLE AS A CURRENT LIMITING LAYER FOR RERAM APPLICATIONS

This application claims priority to U.S. Provisional Patent Application No. 61/785,069 entitled "ReRAM Materials" filed on Mar. 14, 2013, which is incorporated herein by reference.

FIELD OF THE INVENTION

This invention relates generally to nonvolatile memory elements, and more particularly, to methods for forming resistive switching memory elements used in nonvolatile memory devices

BACKGROUND

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments. Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive memory device, e.g., resistive switching nonvolatile random access memory (ReRAM) is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide films has been demonstrated. Further, new switching materials have been proposed, such as memory devices using ZnTe switching layer and aluminum electrodes on glass substrates. However, the performance of ZnTe memory devices, including the switching characteristics of ZnTe, is still insufficient to be of use within a practical nonvolatile memory device.

Therefore, there is a need for a memory device that can meet the design criteria for advanced memory devices.

SUMMARY

In some embodiments, methods and devices for forming resistive memory devices are provided. The resistive memory devices can include a switching layer of ZnTe, disposed between two electrodes of TiN or Pt. The composition and combination of such memory devices are designed to achieve desirable performance characteristics, such as low current leakage as well as low and consistent switching currents. The switching layer may be deposited using various techniques, such as sputtering and atomic layer deposition (ALD).

In some embodiments, a resistive random access memory cell includes a first layer operable as a first electrode, a second layer operable as a second electrode, and a third layer operable as a resistive switching layer and disposed between the first layer and the second layer. The third layer includes zinc and tellurium. The concentration of zinc in the third layer may be between about 40 and 60 atomic percent.

In some embodiments, methods are provided for forming a resistive random access memory cell. The methods may involve providing a substrate including a first electrode of TiN or Pt, depositing a ZnTe layer over the first electrode using atomic layer deposition (ALD), followed by depositing a second electrode of TiN or Pt. A high temperature anneal can be performed for a temperature between 400 C and 750 C.

In some embodiments, depositing the ZnTe layer involves repeating a deposition cycle until reaching a predetermined thickness. Each deposition cycle involves forming a ZnTe layer using a zinc containing precursor and a tellurium containing precursor. Forming the ZnTe layer may involve exposing a deposition surface to the zinc containing precursor followed by exposing the deposition surface including the zinc containing precursor to the tellurium containing precursor.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1A:
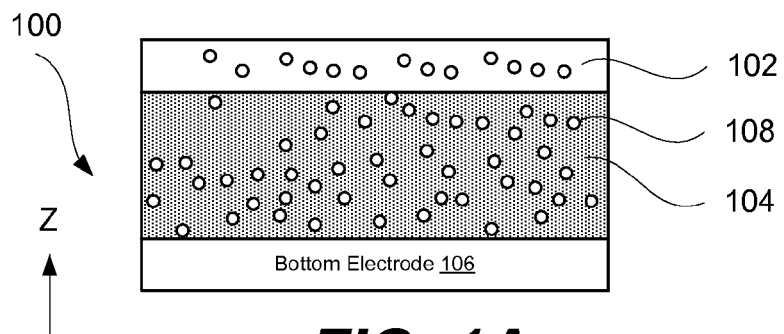
FIGS. 1A-1C illustrate a schematic representation of a ReRAM operation according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding.

These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, methods to fabricate resistive memory devices, and the resistive memory devices fabricated from the methods, are provided in which the resistive memory devices can include a ZnTe switching layer disposed between two electrodes of TiN or Pt. The material combination of ZnTe and TiN or Pt can exhibit a memory performance sufficient for practical nonvolatile memory devices. In addition, the fabrication process of the ZnTe switching layer, including high temperature anneal and/or atomic layer deposition, can further enhance the memory performance.

A ReRAM cell exhibiting resistive switching characteristics generally includes multiple layers formed into a stack. The structure of this stack is sometimes described as a Metal-Insulator-Metal (MIM) structure. Specifically, the stack includes two conductive layers operating as electrodes. These layers may include metals and/or other conductive materials. The stack also includes an insulator layer disposed between the electrodes. The insulator layer exhibits resistive switching properties characterized by different resistive states of the material forming this layer. As such, this insulator layer is often referred to as a resistive switching layer. These resistive states may be used to represent one or more bits of information. The resistance switching properties of the insulator layer are believed to depend on various defects' presence and distribution inside this layer. For example, different distribution of oxygen vacancies in the layer may reflect different resistance states of the layer, and these states may be sufficiently stable for memory application.

To achieve a certain concentration of defects in the resistance switching layer, the layer has been conventionally deposited with defects already present in the layer, i.e., with preformed defects. In other words, defects are introduced into the layer during its formation. For example, tightly controlled Atomic Layer Deposition (ALD), Physical Vapor Deposition (PVD), or some other low-temperature process to remain within a Back End of Line (BEOL) thermal budget may be used to deposit the insulator layer of the stack. It may be difficult to precisely and repeatedly control formation of these defects particularly in very thin resistance switching layers (e.g., less than 100 Angstroms). For example, when ALD is used to form resistance switching layers, some unreacted precursors may leave carbon-containing residues that impact resistance characteristics of the deposition layers and ReRAM cells including these layers. Furthermore, achieving precise partial saturation repeatedly may be very difficult if possible at all. In the case of PVD, sputtering targets tend to wear out influencing the deposition rates and creating variation in resulting resistance switching layers.

A brief description of ReRAM cells and their switching mechanisms are provided for better understanding of various features and structures associated with methods of forming nonvolatile memory elements further described below. ReRAM is a non-volatile memory type that includes dielectric material exhibiting resistive switching characteristics. A dielectric, which is normally insulator, can be made to conduct through one or more filaments or conduction paths formed after application of a sufficiently high voltage. The conduction path formation can arise from different mechanisms, including defects, metal migration, and other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

Figure 1B:
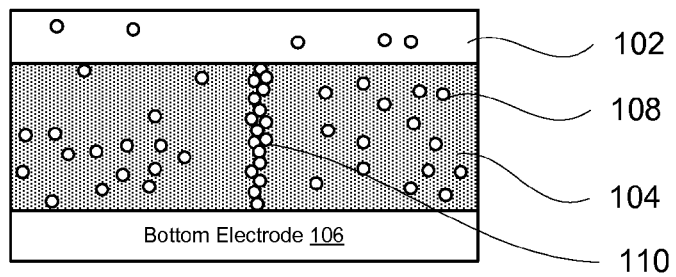
Figure 1C:
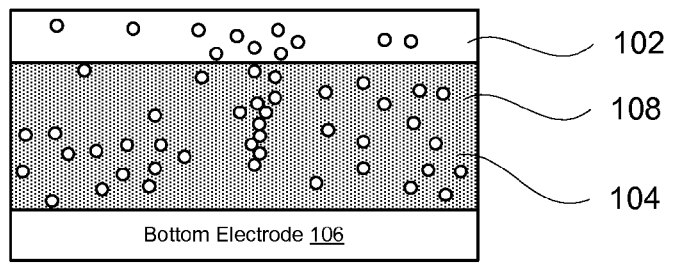

FIGS. 1A-1C illustrate a schematic representation of a ReRAM operation according to some embodiments. A basic building unit of a memory device is a stack having a capacitor like structure. A ReRAM cell includes two electrodes and a dielectric positioned in between these two electrodes. FIG. 1A illustrates a schematic representation of ReRAM cell 100 including top electrode 102, bottom electrode 106, and resistance switching layer 104 provided in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", are used identify the two electrodes. ReRAM cell 100 may also include other components, such as an embedded resistor, diode, and other components. ReRAM cell 100 is sometimes referred to as a memory element or a memory unit.

Top electrode 102 and bottom electrode 106 may be used as conductive lines within a memory array or other types of devices that ReRAM cell is integrated into. As such, electrode 102 and 106 are generally formed from conductive materials. As stated above, one of the electrodes may be reactive electrode and act as a source and as a reservoir of defects for the resistive switching layer. That is, defects may travel through an interface formed by this electrode with the resistive switching layer (i.e., the reactive interface). The other interface of the resistive switching layer may be inert and may be formed with an inert electrode or a diffusion barrier layer.

Resistance switching layer 104 which may be initially formed from a dielectric material and later can be made to conduct through one or more conductive paths formed within the layer by applying first a forming voltage and then a switching voltage. To provide this resistive switching functionality, resistance switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

In some embodiments, these defects may be utilized for ReRAM cells operating according to a valence change mechanism, which may occur in specific transition metal oxides, nitrides, and oxy-nitrides. For example, defects may be oxygen vacancies triggered by migration of oxygen anions. Migrations of oxygen anions correspond to the motion of corresponding oxygen vacancies that are used to create and break conductive paths. A subsequent change of the stoichiometry in the transition metal oxides leads to a redox reaction expressed by a valence change of the cation sublattice and a change in the electrical conductivity. In this example, the polarity of the pulse used to perform this change determines the direction of the change, i.e., reduction or oxidation. Other resistive switching mechanisms include bipolar electrochemical metallization mechanisms and thermochemical mechanisms, which leads to a change of the stoichiometry due to a current-induced increase of the temperature. Some of these mechanisms will be further described below with reference to FIGS. 1A-1C. In the described examples, top electrode 102 is reactive, while bottom electrode 106 is inert or is separated from resistive switching layer 104 by a diffusion barrier layer (not shown). One having ordinary skills in the art would understand that other arrangements are possible as well and within the scope of this disclosure.

Specifically, FIG. 1A is a schematic representation of ReRAM cell 100 prior to initial formation of conductive paths, in accordance with some embodiments. Resistive switching layer 104 may include some defects 108. Additional defects 108 may be provided within top electrode 102 and may be later transferred to resistive switching layer 104 during the formation operation. In some embodiments, the resistive switching layer 104 has substantially no defects prior to the forming operation and all defects are provided from top electrode 102 during forming. Bottom electrode 106 may or may not have any defects. It should be noted that regardless of the presence or absence of defects in bottom electrode 106, substantially no defects are exchanged between bottom electrode 106 and resistive switching layer 104 during forming and/or switching operations.

During the forming operation, ReRAM cell 100 changes its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistance switching layer 104 to form these conductive paths 110 as, for example, schematically shown in FIG. 1B. Furthermore, some or all defects 108 forming the conductive paths may enter resistive switching layer 104 from top electrode 102. For simplicity, all these phenomena are collectively referred to as reorientation of defects within ReRAM cell 100. This reorientation of defects 108 occurs when a certain forming voltage 104 is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Resistive switching involves breaking and reforming conductive paths through resistive switching layer 104, i.e., switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or re-formed. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistance state (LRS), while the state illustrated in FIG. 1C is referred to as a high resistance state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into top electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and top electrode 102, the conductive paths may break closer to the interface with bottom electrode 106, somewhere within resistive switching layer 104, or at the interface with top electrode 102. This breakage generally does not correspond to complete dispersion of defects forming these conductive paths and may be a self limiting process, i.e., the process may stop after some initial breakage occurs.

When switching from its HRS to LRS, which is often referred to as a set operation, resistive switching layer 104 may receive some defects from top electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 104 during the set operation has the same polarity as a voltage applied during the reset operation. This type of switching is referred to as unipolar switching. Some examples of cells that exhibit unipolar switching behavior include resistive switching layers formed from most metal oxide and having inert electrodes at both sides, e.g., Pt/MeO$_x$/Pt. Alternatively, a voltage applied to electrodes 102 and 104 during the set operation may have different polarity as a voltage applied during the reset operation. This type of switching is referred to as bipolar switching. Some examples of cells that exhibit bipolar switching behavior include resistive switching layers formed from MeOx having one inert electrode and one reactive electrode, e.g., TiN/MeOx/Pt and TiN/MeOx/poly-Si.

Figure 2:
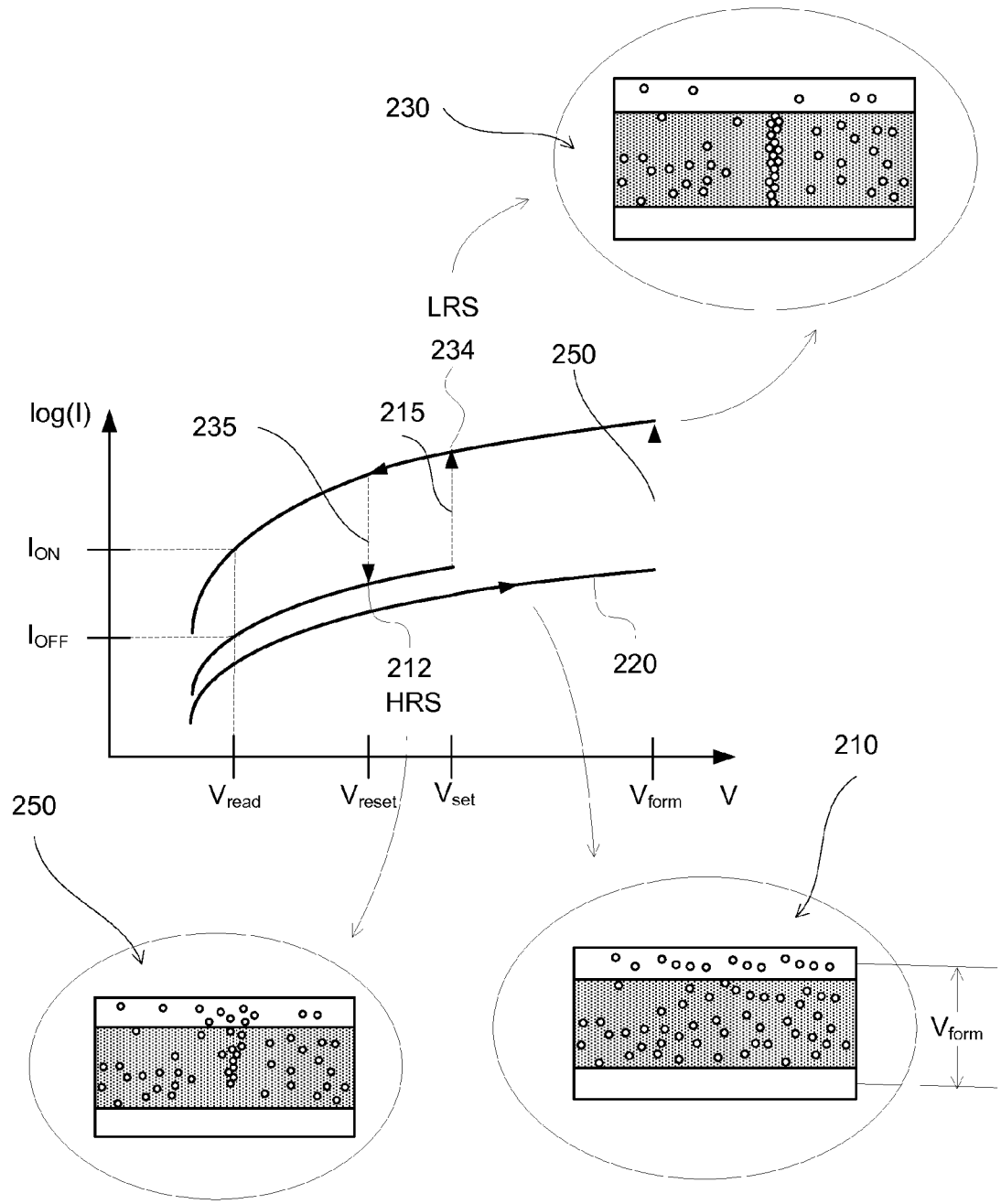
FIG. 2 illustrates a plot of a current passing through a unipolar ReRAM cell as a function of a voltage applied to the ReRAM cell according to some embodiments.

FIG. 2 illustrates a plot of a current passing through a unipolar ReRAM cell as a function of a voltage applied to the ReRAM cell according to some embodiments. A metal-insulator-metal (MIM) structure 210 can be first fabricated with an amount of defects embedded in the insulator layer. A voltage or current 220 can be applied to the MIM structure to form a resistive memory device from the MIM structure, for example, by making the insulator layer becoming a switching layer. By applying a forming voltage $V_{form}$, the randomly distributed defects can be transitioned 250 to lower resistance configurations, for example, in the form of filaments 230.

The lower resistance configurations can be characterized as a low resistance state (LRS) 234 for the resistive memory device, which persists even when the voltage is reduced. The LRS can represent a logic state of the memory device, such as a logic zero ("0").

At LRS, when another voltage, e.g., $V_{reset}$ is applied, the resistance can be transitioned 235 to a high resistance state (HRS), which persists even when the voltage is reduced. The HRS can represent another logic state of the memory device, such as a logic one ("1"). The reset voltage $V_{reset}$ is smaller than the forming voltage $V_{form}$.

At HRS, when another voltage, e.g., $V_{set}$ is applied, the resistance can be transitioned 215 back to the low resistance state (LRS), which persists even when the voltage is reduced. The set voltage $V_{set}$ is also smaller then the forming voltage $V_{form}$.

Overall, the ReRAM cell may be switched back and forth between its LRS and HRS many times. For example, when it is desired to turn "ON" the cell, e.g., to have a LRS, a set operation can be performed through the application of a set voltage $V_{set}$ to the electrodes. Applying the set voltage forms one or more conductive paths in the resistance switching layer as shown in 230. If it is desired to turn "OFF" the ReRAM cell, e.g., to change to HRS, a reset operation can be performed through the application of a reset voltage $V_{reset}$ to the electrodes. Applying the reset voltage can destroy the conductive paths in the resistance switching layer as shown in 250.

The polarity of the reset voltage and the set voltage may be the same in unipolar memory devices, or may be different in bipolar devices (not shown). Without being restricted to any particular theory, it is believed that the resistive switching occurs due to filament formation and destruction caused by the application of electrical field.

Read operations may be performed in each of these states (between the switching operations) one or more times or not performed at all. During the read operation, the state of the ReRAM cell or, more specifically, the resistive state of its resistance of resistance switching layer can be sensed by applying a sensing voltage to its electrodes. The sensing voltage is sometimes referred to as a read voltage $V_{read}$.

In some embodiments, the set voltage $V_{set}$ is between about 100 mV and 10V or, more specifically, between about 500 mV and 5V. The length of set voltage pulses may be less than about 100 milliseconds or, more specifically, less than about 5 milliseconds and even less than about 100 nanoseconds. The read voltage $V_{read}$ may be between about 0.1 and 0.5 of the set voltage $V_{set}$. In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse may be comparable to the length of the corresponding set voltage pulse or may be shorter than the write voltage pulse. ReRAM cells should be able to cycle between LRS and HRS between at least about $10^3$ times or, more specifically, at least about $10^7$ times without failure. A data retention time should be at least about 5 years or, more specifically, at least about 10 years at a thermal stress up to 85° C. and small electrical stress, such as a constant application of the read voltage. Other considerations may include low current leakage, such as less than about 40 A/cm² measured at 0.5 V per 20 Å of oxide thickness in HRS.

Practical applications of ReRAM cells require certain switching, data retention, and other characteristics. For example, ReRAM cells need to have low leakage, low switching currents, stable performance over a large number of switching cycles. It has been found that a composition, morphology, and deposition process of resistive switching layers, together with appropriate electrode materials, have to be specifically tuned to meet these requirements. For example, ZnTe deposited by thermal evaporation between aluminum electrodes may have poor switching characteristics, e.g., a poor write-erase lifetime. Combining ZnTe switching layer with TiN or Pt electrodes can improve some of the switching characteristics. It has been found that a high temperature anneal of ZnTe, and/or a controlled formation of ZnTe, e.g., ZnTe deposited by atomic layer deposition (ALD) can also assist in improve the performance of ZnTe memory devices. Without being restricted to any particular theory, it is believed that ZnTe resistive memory cells, having TiN or Pt electrodes, having ZnTe deposited by ALD, and/or having high temperature anneal, may help to improve the switching characteristics of ZnTe layers, for example, removing negative resistance behavior or better write-erase performance.

In some embodiments, ReRAM cells and methods to fabricate ReRAM cells are provided with ZnTe switching layers disposed between TiN or Pt electrodes. The ZnTe layers can be deposited by atomic layer deposition, using Zn containing precursors and Te containing precursors. The ReRAM cells or the ZnTe layers can be annealed in high temperatures between 400 and 750 C. In some embodiments, The ZnTe switching layers are specifically designed to achieve desirable performance characteristics of ReRAM cells.

The ZnTe layer may be deposited using various techniques, such as sputtering and atomic layer deposition (ALD). The ALD approaches may be further divided into nanolamination ALD or staggered pulse ALD. The following description of these approaches is directed to the formation of ZnTe layer by a Zn layer followed by a Te layer. However, one having ordinary skills in the art would understand that such processes may also involve formation of a Te layer followed by a Zn layer.

ALD may involve a staggered pulse deposition, including introducing a zinc containing precursor into an ALD chamber followed by introducing a tellurium containing precursor into the ALD chamber. The zinc containing precursor can include zinc chloride ($ZnCl_2$), dimethyl zinc ($Zn(CH_3)_2$, or diethyl zinc ($Zn(C_2H_5)_2$). The tellurium containing precursor can include hydrogen telluride ($TeH_2$), diethyl telluride (Te$(C_2H_5)_2$), and isopropyl telluride ($Te((CH_3)CH)_2$). In some embodiments, a tellurium containing precursor is introduced into the chamber prior to introducing a zinc containing precursor. This order depends on the type of metal precursors (their adsorption characteristics, size, reactivity, and other like characteristics) and desired composition of the resulting ZnTe layer. In some embodiments, concentration of zinc relative to the total amount of metal (i.e., Zn/(Zn+Te)) ranges from 40 to 70 atomic percent.

The deposition sequence of Zn and Te containing precursors may be repeated a number of times until the ZnTe layer become sufficiently thick. The resulting ZnTe layer can then be annealed, for example, at temperatures between 400 and 750 C.

Figure 3:
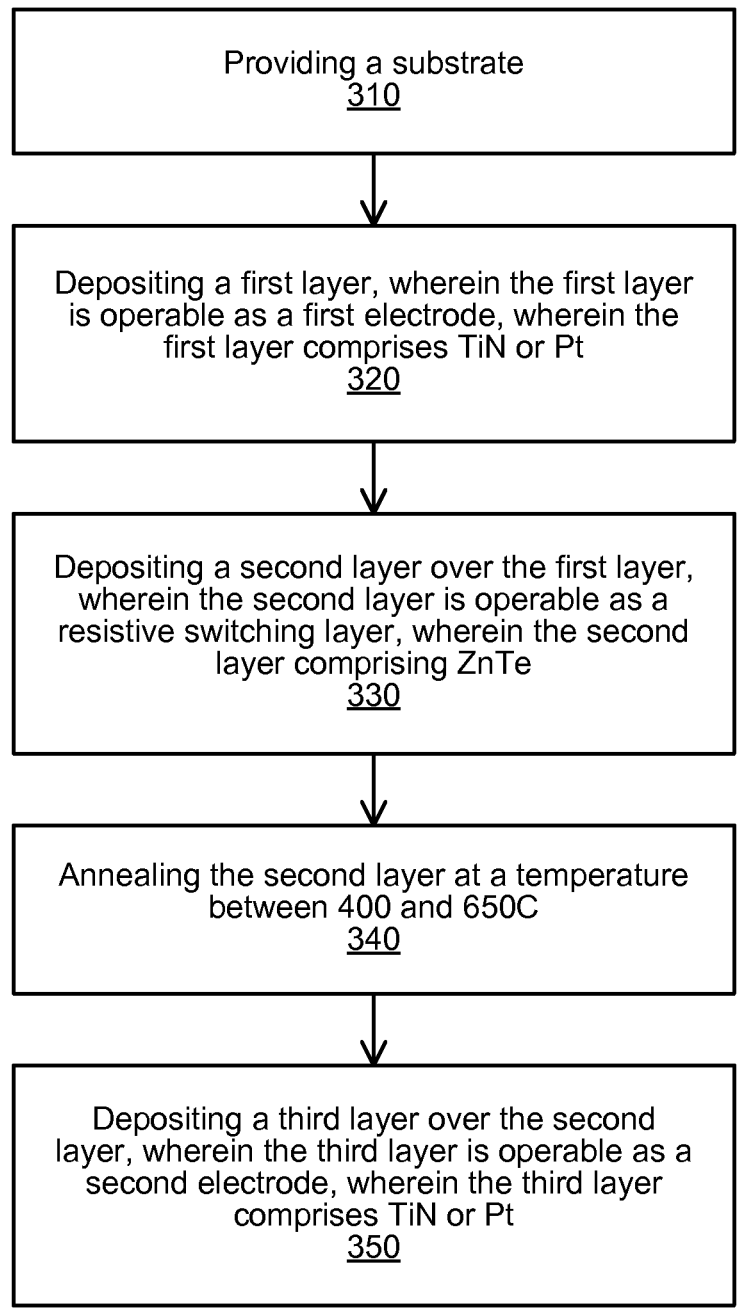
FIG. 3 illustrates a flowchart for forming a memory device according to some embodiments.

FIG. 3 illustrates a flowchart for forming a memory device according to some embodiments. The described flowchart is a general description of techniques used to form the memory devices described above. The flowchart describes techniques for forming a memory device generally including two electrodes and one or more layers disposed there between. Although certain processing techniques and specifications are described, it is understood that various other techniques and modifications of the techniques described herein may also be used.

In operation 310, a substrate is provided. The substrate can be used for receiving various deposited components of the ReRAM cell. Furthermore, the same substrate often is used for receiving components of multiple ReRAM cells. For example, large memory cell arrays may be formed on the same substrate. Components of multiple ReRAM cells may be formed from the same set of initial layers formed on that substrate. The substrate may include one or more signal lines or contacts. These lines or contacts provide an electrical connection to a bottom electrode. In some embodiments, the bottom electrode formed in a subsequent operation can serve as a signal line. In a similar manner, a top electrode formed in another subsequent operation can function as a signal line or it may be connected to a separate signal line.

In operation 320, a first layer is deposited on the substrate. The first layer can be operable as a first or bottom electrode.

The bottom electrode can include titanium nitride or platinum. The bottom electrode may be formed using ALD, CVD, sputtering, or some other techniques. For example, a titanium nitride electrode may be formed using sputtering. Deposition of the titanium nitride electrode may be performed using a titanium target in a nitrogen atmosphere maintained at a pressure of between about 1-20 mTorr. The power may be maintained at 150-500 Watts that may result in a deposition rate of about 0.5-5 Angstroms per second (depending on the size of the target sample and other process parameters). Some of the provided process parameters are for illustrative purposes only and generally depend on deposited materials, tools, deposition rates, and other factors. The bottom electrode may have any thickness, for example between about 5 nm and about 500 nm thick.

In operation 330, a second layer is deposited over the first layer. The second layer can contain zinc and tellurium, which can be operable as a switching layer after subjected to a forming process.

The second layer may be formed using reactive sputtering, ALD, or other techniques. For example, the base layer may be formed using reactive sputtering by employing a zinc target and a telluride target in vacuum or an inert atmosphere. Power of 100-1000 Watts (W) may be used to achieve deposition rates of between about 0.1 and 1.0 Angstroms per second. These process parameters are provided as examples and generally depend on deposited materials, tools, deposition rates, and other factors.

In some embodiments, the second layer is formed using ALD. This technique includes one or more cycles, each involving the following two four steps: introducing one or more first precursors, such as a zinc containing precursor, into the depositing chamber to form an absorbed layer, followed by purging these precursors reactive agents, and then introducing one or more second precursors, such as a tellurium containing precursor, that will react with the absorbed layer to form a portion of or the entire second layer, followed by purging the second precursor reactive agents. Selection of precursors and processing conditions depend on desired composition, morphology, and structure of each portion of the electrode.

A layer formed during each atomic layer deposition cycle described above may be between less than about 0.5 nm thick, such as between 0.02 and 0.02 nm. The cycle may be repeated multiple times until the overall second layer (and subsequently the thickness of the resistive switching layer) reaches it desired thickness. In some embodiments, the thickness of the resistive switching layer is less than 30 nm, such as less than 10 or 5 nm, e.g., between 2 and 10 nm. In general, the thickness of the resistive switching layer is at least about 1 nm or, more specifically, at least about 2 nm, as thin films may be considered too "leaky."

ALD techniques are now briefly described to provide better understanding of various processing features. First precursors can be introduced into the ALD chamber and allowed to flow over the deposition surface (which may have previously deposited ALD layers) provided therein. The first precursors can include one or more precursors. For example, the first precursors can include a zinc containing precursor. Alternatively, the first precursors can include a tellurium containing precursor. The first precursors can include two or more precursors, such as a zinc containing precursor and a reactive precursor such as reactive hydrogen or remote plasma hydrogen.

The first precursors can be introduced in the form of pulses. Between the pulses, the reaction chamber is purged, for example, with an inert gas to remove unreacted precursors, reaction products, and other undesirable components from the chamber.

The introduced precursor adsorbs (e.g., saturatively chemisorbs) on the deposition surface. Subsequent pulsing with a purging gas removes excess precursor from the deposition chamber. In some embodiments, purging is performed before full saturation of the substrate surface occurs with the precursors. In other words, additional precursor molecules could have been further adsorbed on the substrate surface if the purging was not initiated so early. Without being restricted to any particular theory, it is believed that partial saturation can be used to introduce defects into the formed layer, e.g., during forming of a resistive switching layer.

After the initial precursor pulsing and purging of the first precursors, a subsequent pulse introduces second precursors. The second precursors can act as reactant agent to react with the adsorbed metal containing molecules. The second precursors can include one or more precursors. For example, the second precursors can include a tellurium containing precursor if the first precursors include a zinc containing precursor. Alternatively, the second precursors can include a zinc containing precursor if the first precursors include a tellurium containing precursor. The second precursors can include two or more precursors, such as a tellurium containing precursor and a reactive precursor such as reactive hydrogen or remote plasma hydrogen.

Reaction byproducts and excess reactants are then purged from the deposition chamber. The saturation during the reaction and purging stages makes the growth self-limiting. This feature helps to improve deposition uniformity and conformality and allows more precise control of the resulting resistive switching characteristics.

The temperature of the substrate during atomic layer deposition may be between about 200° C. to 350° C. The precursor may be either in gaseous phase, liquid phase, or solid phase. If a liquid or solid precursor is used, then it may be transported into the chamber an inert carrier gas, such as helium or nitrogen.

Some examples of zinc containing precursors include zinc acetate ($Zn(CH_3CO_2)_2$), zinc halides, such as $ZnBr_2$, $ZnCl_2$, $ZnF_2$, and $ZnI_2$, di-methyl zinc, diethyl zinc, ethyl methyl zinc, and other organometallic compounds containing zinc. Some examples of tellurium containing precursors include telluride halides, such as $TeCl_2$, $TeBr_2$ and $TeI_2$, diethyl telluride, dimethyl telluride, methyl(allyl)telluride, diallyl telluride, di-isopropyl telluride, di-tert-butyl telluride, ethyl(allyl)telluride, isopropyl(allyl)telluride, tertiarybutyl(allyl)telluride, methyl(benzyl)telluride, methyl(pentadienyl)telluride, and other organometallic compounds containing tellurium.

In operation 340, an optional treatment can be performed after depositing the insulator layer. The treatment can include a plasma treatment or a high temperature treatment. For example, the treatment can include a rapid thermal anneal at 400-750 C in non-reactive ambient. The treatment can be performed in-situ after the deposition of the ZnTe layer. The treatment can include a hydrogen radical anneal, e.g., plasma anneal in a hydrogen ambient.

In operation 350, a third layer is deposited over the second layer. The third layer can be operable as a second or top electrode. The top electrode can include titanium nitride or platinum. The top electrode may be formed using ALD, CVD, sputtering, or some other techniques. For example, a platinum electrode may be formed using sputtering. Deposition of the platinum electrode may be performed using a platinum in a nitrogen atmosphere maintained at a pressure of between about 1-20 mTorr. The power may be maintained at 150-500 Watts that may result in a deposition rate of about 0.5-5 Angstroms per second (depending on the size of the target sample and other process parameters). Some of the provided process parameters are for illustrative purposes only and generally depend on deposited materials, tools, deposition rates, and other factors. The top electrode may have any thickness, for example between about 5 nm and about 500 nm thick.

In some embodiments, the top and bottom electrodes include a same material, e.g., both electrodes contain titanium nitride or platinum. Alternatively, the top and bottom electrodes can have different materials. For example, the top electrode can contain titanium nitride and the bottom electrode contains platinum.

Figure 4:
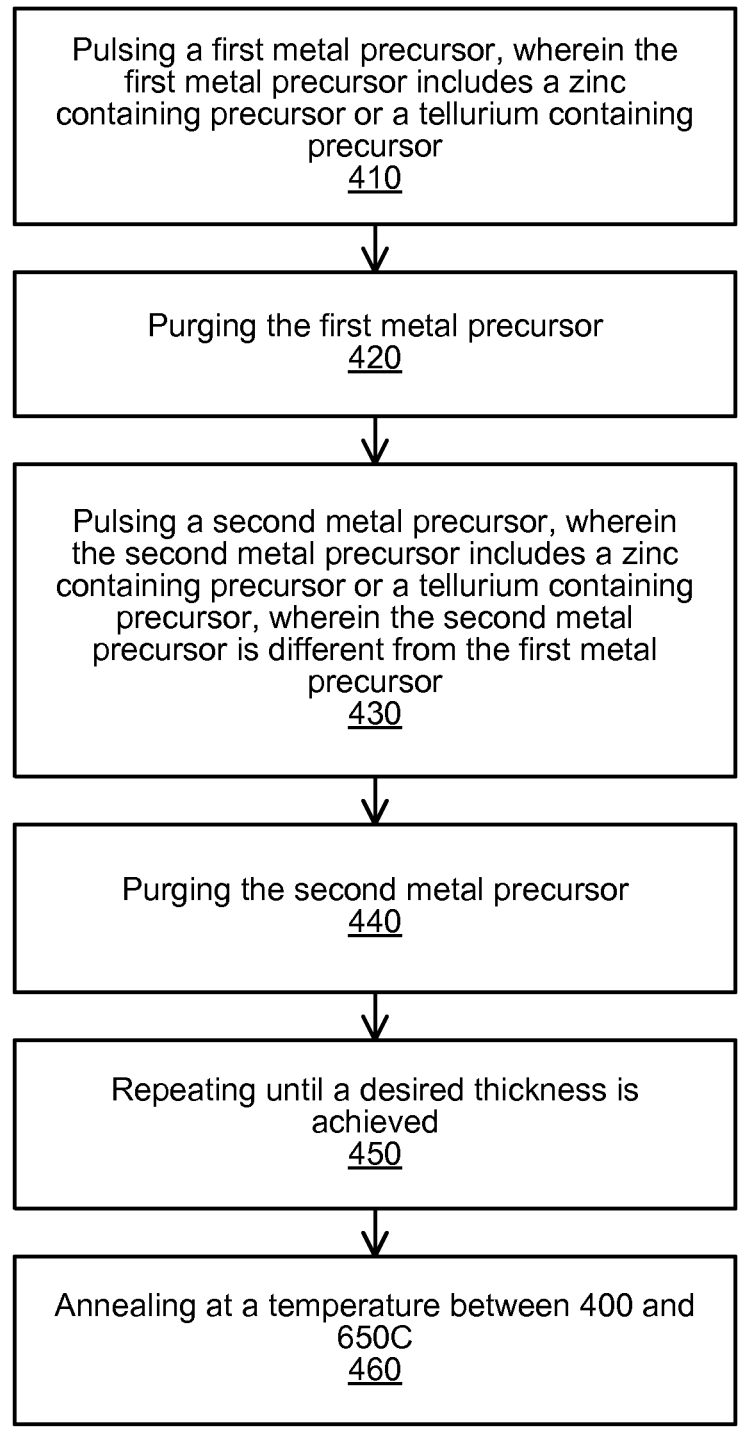
FIG. 4 illustrates a flowchart for forming a memory device according to some embodiments.

FIG. 4 illustrates a flowchart for forming a memory device according to some embodiments. A substrate can be first prepared, for example, by forming a bottom electrode containing titanium nitride or platinum on a substrate.

In operation 410, a first metal containing precursor can be pulsed into an ALD chamber. The first metal containing precursor may include zinc or tellurium. For example, a zinc containing precursor can be introduced to the chamber as a pulse. A purge gas may be provided continuously with the pulse or may be discontinued during the pulse. The purge gas is non-reactive or inert at given process conditions and may include nitrogen ($N_2$) or helium (He). At least a portion of the precursor adsorbs onto or reacts with the surface of the bottom electrode. Adsorption of the precursor depends on the availability of adsorption sites. When these sites are all consumed (i.e., a fully saturated processing layer is formed), no more metal containing precursor can adsorb, and any remaining precursor is removed by flowing the purge gas.

In operation 420, the remaining portions of the first metal containing precursor can be purged from the chamber after the first precursor is adsorbed on the deposition surface.

In operation 430, a pulse of a second metal containing precursor can be provided to the deposition chamber. The second metal containing precursor can be introduced to the chamber as a pulse. The second metal containing precursor may include zinc or tellurium. The second metal containing precursor can be different from the first metal containing precursor. For example, the second metal containing precursor can include a zinc containing precursor if the first metal containing precursor includes a tellurium containing precursor.

The second metal precursor can act as a reactant agent for reacting with the adsorbed precursor, e.g., the first metal precursor which is absorbed on the substrate surface, and can form a ZnTe film.

In operation 440, the second metal containing precursor can then be purged from the deposition chamber. In operation 450, this cycle may be repeated until the desired thickness of a ZnTe layer is formed. In some embodiments, the ratio of zinc over tellurium can vary by changing the precursor pulsing times. For example, a higher ratio of zinc in the ZnTe layer can be formed by a long pulse of zinc containing precursor followed by a shorter pulse of tellurium containing precursor.

In operation 460, the deposited ZnTe layer can be annealed, for example, at temperatures between 400 and 750 C in an inactive ambient such as a nitrogen ambient, a hydrogen ambient, or a forming gas ambient.

Once the ZnTe layer is formed, a top electrode can be deposited. The top electrode may also be deposited in a manner similar to the bottom electrode as described above. Other layers, such as interface or capping layers, current limiting layers, and other layer may be deposited in the stack, e.g., between the top electrode and the resistive switching layer and/or between the bottom electrode and the resistive switching layer.

Figure 5:
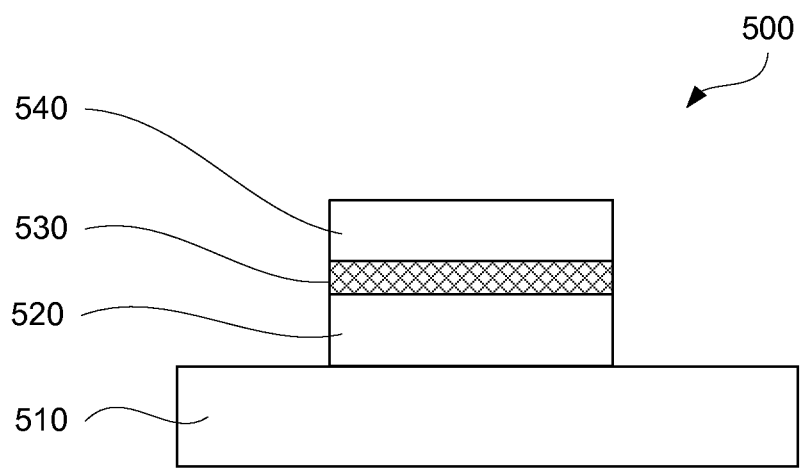
FIG. 5 illustrates a schematic representation of resistive switching ReRAM cell according to some embodiments.

FIG. 5 illustrates a schematic representation of resistive switching ReRAM cell according to some embodiments. Resistive switching ReRAM cell 500 includes substrate 510, which may include a signal line. Alternatively, bottom electrode 520 may serve as a signal line. Substrate 510 provides a surface for deposition of bottom electrode 520. Bottom electrode 520 is disposed between substrate 510 and resistive switching layer 530. Top electrode 540 is provided above resistive switching layer 530.

Resistive switching layer 530 includes zinc and tellurium. It should be noted that resistive switching layer 530 may include any concentrations of these two elements and are not limited by any stoichiometric ratios. In some embodiments, the concentration of zinc in the switching layer is between about 30 and 70 atomic percent.

The material of resistive switching layer 530 can be substantially amorphous or nanocrystalline after formation of this layer. In some embodiments, resistive switching layer 530 remains substantially amorphous after further processing of the layer, such as annealing, applying a formation voltage, and other operations. Furthermore, in some embodiments, resistive switching layer 530 remains substantially amorphous during operation of ReRAM cell, i.e., applying switching voltages and reading voltages that drive corresponding currents.

In some embodiments, the thickness of restive switching layer 530 is less than about 30 nm, such as between about 2 and 10 nm or, more specifically, between about 4 and 7 nm, for example, about 5 nm. The thickness of top and bottom electrodes 520 and 540 may be at least about 3 and 100 nm or, more specifically, between about 10 and 50 nm. In some embodiments, the thickness of one or both electrodes is less than 5 nm. Such electrodes may be deposited using ALD techniques.

Electrodes 520 and 540 provide electronic communication to resistive switching layer 530 of ReRAM cell 500. One or both electrodes may directly interface resistive switching layer 530 or be spaced apart by other layers, such as barrier layers, current limiting layer, and the like. Depending on the materials used for electrode construction, the electrode (e.g., an electrode formed from titanium nitride) itself may also serve as an adhesion layer and/or barrier layer. In some embodiments, one or both electrodes are also function as signal lines (i.e., bit and/or word lines) and are shared by other ReRAM cells.

Some examples of electrode materials include titanium nitride (TiN), and platinum. In some embodiments, barrier layers, adhesion layers, antireflection coatings and/or other layers may be used with the electrodes and to improve device performance and/or aid in device fabrication.

In some embodiments, one electrode may be a higher work function material, and the other electrode may be a lower work function material than the resistive switching layer. For example, an electrode can include titanium nitride and the other electrode can include platinum. Platinum is a noble metal (i.e., a metal with a low absolute value free energy change ($|\Delta G|$) of oxide formation), which may be used for one electrode. The other electrode may be a lower work function material, such as titanium nitride. In some embodiments, the reset pulse at the electrode having the higher work function may be a positive pulse.

In some embodiments, one or both electrodes may be multi-layer electrodes formed by one or more different materials. For example, an electrode can include a base layer and capping layer. The base layer may include platinum, or titanium nitride. The capping layer may include tungsten, tungsten carbon nitride, and/or tungsten carbon. The multi-layer electrodes can be used to improve adhesion properties and performance of memory elements in some configurations and embodiments.

ReRAM cell 500 may include another layer (not shown) that is operable as a current limiting layer. A material for this layer may have a suitable work function for controlling the electron flow through ReRAM cell. This specific selection may alter the magnitude of the generated switching currents. In some embodiments, the current limiting layer is used to increase or decrease the formed barrier height at the interface with resistive switching layer 530. This feature is used to improve current flowing characteristics and reduce the magnitude of the switching currents. It should be noted that these changes in the barrier height will generally not affect the current ratio ($I_{ON}/I_{OFF}$), and thus not impacts detectability of different resistive states.

In some embodiments, the current limiting layer is between about 5 and 100 nm thick, such as between about 5 and 20 nm. This layer may be formed from a material that has a resistivity of between about 5 Ohm-cm and 500 Ohm-cm, such as between about 50 Ω-cm and 150 Ω-cm. In some embodiments, the current limiting layer is formed such that its resistance ($R_{RL}$) is between about 10 kΩ and about 10 MΩ, such as between about 100 kΩ and about 1 MΩ.

Resistivity is a property of the material and can be controlled by adjusting the composition of the material. Some specific examples, include adding alloying elements or doping atoms and/or adjusting the morphological structure of the materials, (e.g., shifting from amorphous to crystal structure). In some embodiments, a current limiting layer may include titanium oxide doped with niobium, tin oxide doped with antimony, or zinc oxide doped with aluminum. The concentration of dopant materials in the base material may be between about 0.5 and 25 atomic % or, more specifically, between about 1 and 10 atomic %.

Other examples of materials suitable for the current limiting layer include titanium nitride ($Ti_xN_y$), tantalum nitride ($Ta_xN_y$), silicon nitride ($Si_xN_y$), hafnium nitride ($Hf_xN_y$) or titanium aluminum nitride ($Ti_xAl_yN_z$) layer. Such layers may be formed using an ALD, CVD or PVD process as further described below.

Figure 6:
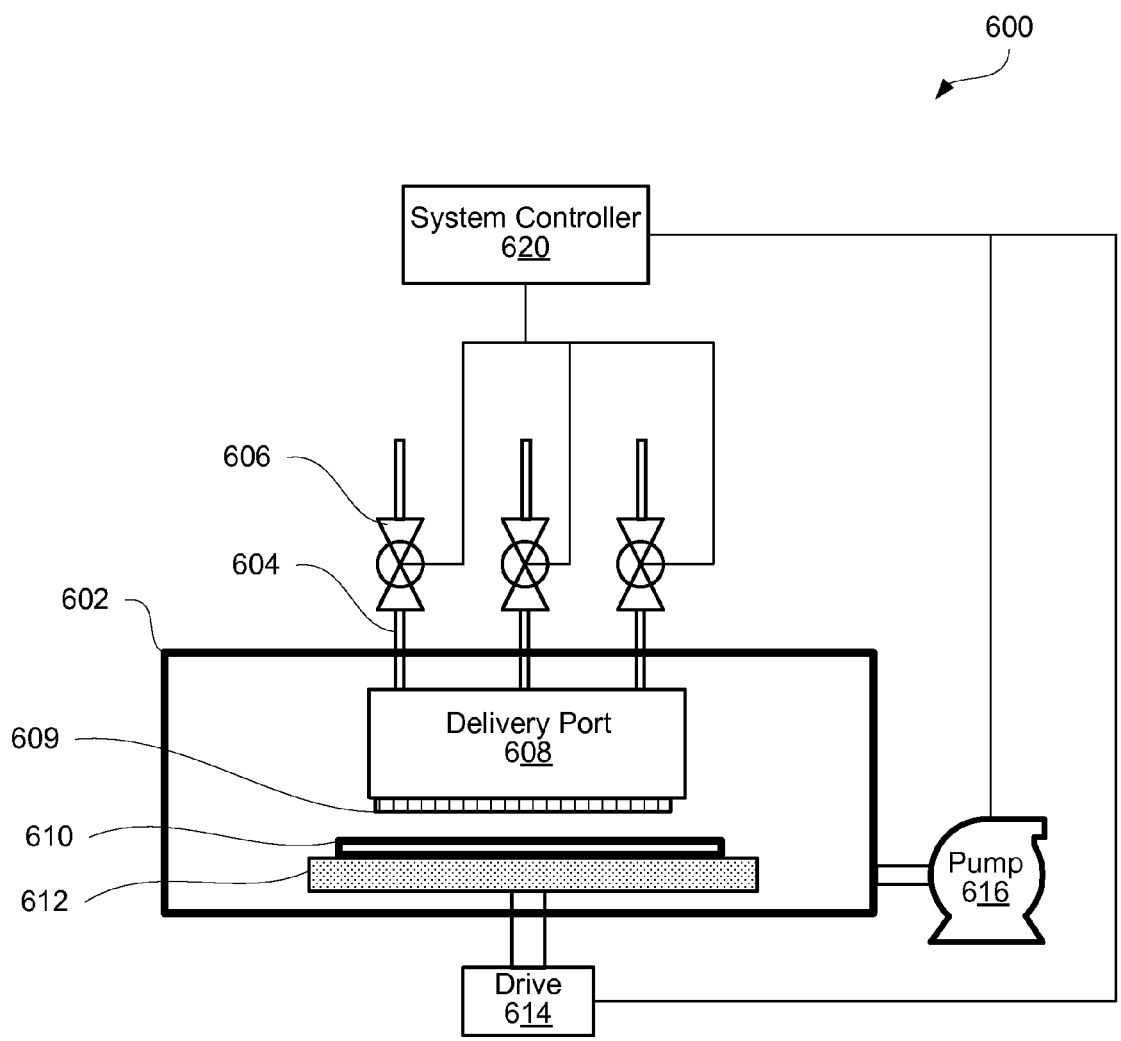
FIG. 6 illustrates a schematic representation of atomic layer deposition apparatus for fabricating ReRAM cells according to some embodiments.

FIG. 6 illustrates a schematic representation of atomic layer deposition apparatus for fabricating ReRAM cells according to some embodiments. For clarity, some components of apparatus 600 are not included in this figure, such as a wafer-loading port, wafer lift pins, and electrical feed throughs. Apparatus 600 includes deposition chamber 602 connected to processing gas delivery lines 604. While FIG. 6 illustrates three delivery lines 604, any number of delivery lines may be used. Each line may be equipped with a valve and/or mass flow controller 606 for controlling the delivery rates of processing gases into deposition chamber 602. In some embodiments, gases are provided into delivery port 608 prior to exposing substrate 610 to processing gases. Deliver port 608 may be used for premixing gases (e.g., precursors and diluents) and even distribution of gases over the surface of substrate 610. Delivery port 608 is sometimes referred to as a showerhead. Delivery port 608 may include a diffusion plate 609 having with multiple holes for gas distribution.

Deposition chamber 602 encloses substrate support 612 for holding substrate 610 during its processing. Substrate support 612 may be made from a thermally conducting metal (e.g., W, Mo, Al, Ni) or other like materials (e.g., a conductive ceramic) and may be used to maintain the substrate temperature at desired levels. Substrate support 612 may be connected to drive 614 for moving substrate 610 during loading, unloading, process set up, and sometimes even during processing. Deposition chamber 602 may be connected to vacuum pump 616 for evacuating reaction products and unreacted gases from deposition chamber 602 and for maintaining the desirable pressure inside chamber 602.

Apparatus 600 may include system controller 620 for controlling process conditions during electrode and resistive switching layer deposition and other processes. Controller 620 may include one or more memory devices and one or more processors with a CPU or computer, analog and/or digital input/output connections, stepper motor controller boards, etc. In some embodiments, controller 620 executes system control software including sets of instructions for controlling timing, gas flows, chamber pressure, chamber temperature, substrate temperature, RF power levels (if RF components are used, e.g., for process gas dissociation), and other parameters. Other computer programs and instruction stored on memory devices associated with controller may be employed in some embodiments.

Figure 7A:
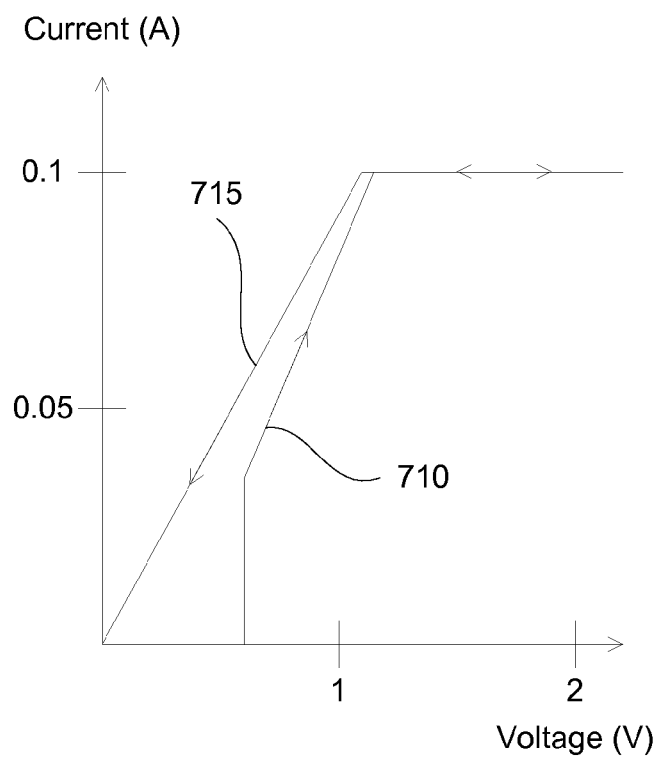
FIGS. 7A-7B illustrate I-V switching curves for ZnTe memory cell having Pt and TiN electrodes according to some embodiments.
Figure 7B:
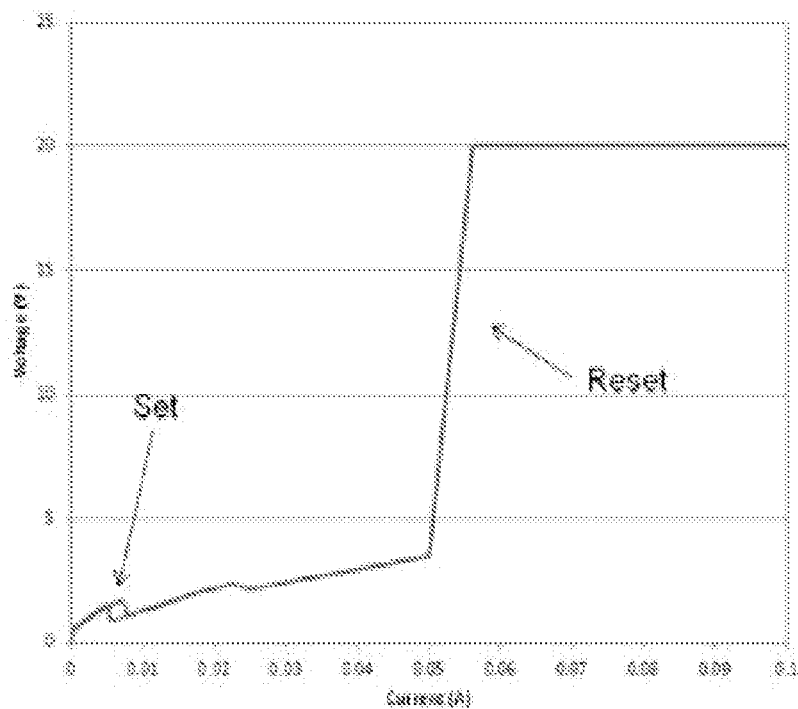

Sample ReRAM devices have been fabricated to evaluate the switching performance of the ZnTe switching layer with TiN or Pt electrodes. FIGS. 7A-7B illustrate I-V switching curves for ZnTe memory cell having Pt and TiN electrodes according to some embodiments. In FIG. 7A, I-V curves are shown for a ZnTe memory cell including a ZnTe switching layer disposed between two Pt electrodes. A first applied voltage is ramped from 0 to 2V, resulting in an I-V curve 710. The I-V curve 710 shows that at about 0.5V, the current exhibits a vertical jump from near zero to about 0.03 A, indicating a set operation. A second applied voltage is ramped from 2 to 0V, resulting in an I-V curve 720. The I-V curve 720 shows a gradual change to zero voltage without the vertical jump.

In FIG. 7B, I-V curves are shown for a ZnTe memory cell including a ZnTe switching layer disposed between two TiN electrodes. A set operation is observed at a current of 0.005 A, and a reset operation is observed at a current of 0.05 A.

Figure 8A:
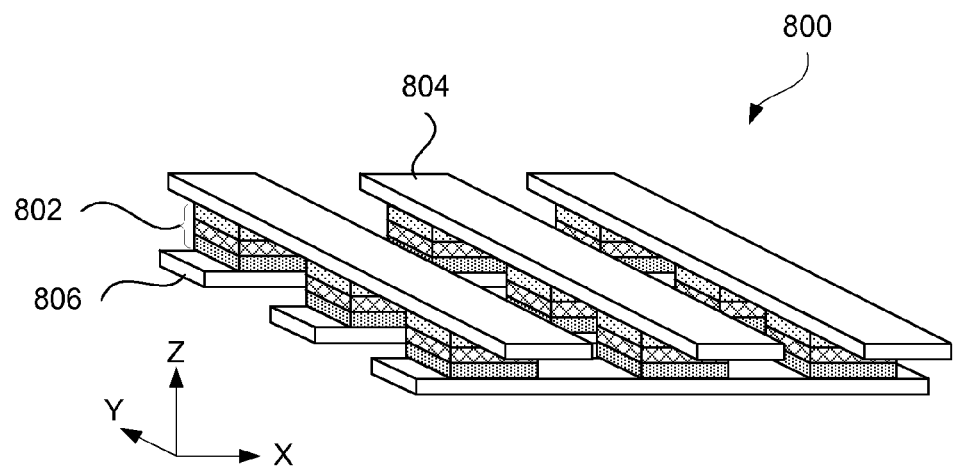
FIG. 8A-8B illustrates memory arrays according to some embodiments.

In some embodiments, the ZnTe memory structures can be used in memory arrays, such as cross point memory arrays. A brief description of memory arrays will now be described with reference to FIGS. 8A and 8B to provide better understanding to various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 8A illustrates a memory array including nine ReRAM cells according to some embodiments. In general, any number of ReRAM cells may be arranged into one array. Connections to each ReRAM cell 802 are provided by signal lines 804 and 806, which may be arranged orthogonally to each other. ReRAM cells 802 are positioned at crossings of signal lines 804 and 806 that typically define boundaries of each ReRAM cell in array 800.

Signal lines 804 and 806 are sometimes referred to as word lines and bit lines. These lines are used to read and write data into each ReRAM cell 802 of array 800 by individually connecting ReRAM cells to read and write controllers. Individual ReRAM cells 802 or groups of ReRAM cells 802 can be addressed by using appropriate sets of signal lines 804 and 806. Each ReRAM cell 802 typically includes multiple layers, such as top and bottom electrodes, resistive switching layer, embedded resistors, embedded current steering elements, and the like, some of which are further described elsewhere in this document. In some embodiments, a ReRAM cell includes multiple resistive switching layers provided in between a crossing pair of signal lines 804 and 806.

As stated above, various read and write controllers may be used to control operations of ReRAM cells 802. A suitable controller is connected to ReRAM cells 802 by signal lines 804 and 806 and may be a part of the same memory device and circuitry. In some embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 800 or each ReRAM cell 802. For example, to avoid the parasitic-path-problem, i.e., signal bypasses by ReRAM cells in their low resistance state (LRS), serial elements with a particular non-linearity must be added at each node or, more specifically, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 8B:
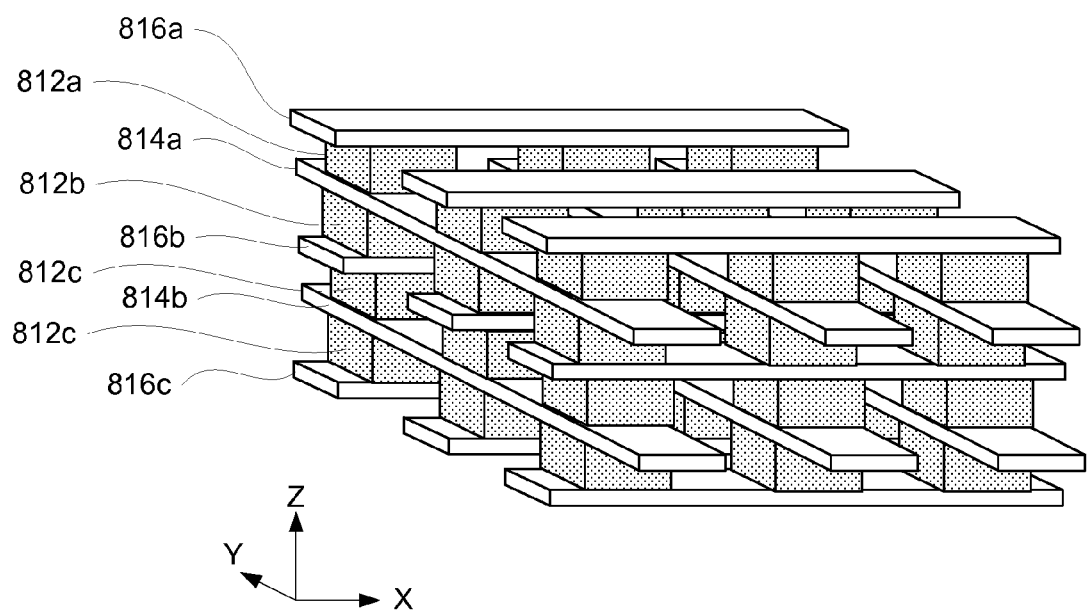

In some embodiments, a memory device may include multiple array layers as, for example, illustrated in FIG. 8B. In this example, five sets of signal lines 814a-b and 816a-c are shared by four ReRAM arrays 812a-c. As with the previous example, each ReRAM array is supported by two sets of signal lines, e.g., array 812a is supported by 814a and 816a. However, middle signal lines 814a-b and 816b, each is shared by two sets ReRAM arrays. For example, signal line set 814a provides connections to arrays 812a and 812b. Top and bottom sets of signal lines 816a and 816c are only used for making electrical connections to one array. This 3-D arrangement of the memory device should be distinguished from various 3-D arrangements in each individual ReRAM cell.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A resistive random access memory cell comprising:
   a first layer operable as a first electrode, wherein the first layer comprises TiN or Pt,
      wherein the first layer comprises a base portion and a capping portion, the base portion operable as a current limiting layer and comprising between about 1 and 10 atomic % of a dopant material;
   a second layer operable as a resistive switching layer,
      wherein the second layer is disposed over the first layer,
      wherein the second layer comprises ZnTe and is substantially amorphous; and
   a third layer operable as a second electrode,
      wherein the third layer is disposed over the second layer,
      wherein the third layer comprises TiN or Pt.

2. A memory cell as in claim 1, wherein a thickness of the second layer is between 2 and 10 nm.

3. A memory cell as in claim 1, wherein the first layer and the third layer each comprise TiN.

4. A memory cell as in claim 1, wherein the first layer and the third layer each comprise Pt.

5. A memory cell as in claim 1, wherein the first layer comprises Pt, and wherein the third layer comprises TiN.

6. A memory cell as in claim 1, wherein the first layer is a first conductive layer and the third layer is a second conductive layer.

7. A memory cell as in claim 1, wherein the second layer is an insulator layer.

8. A memory cell as in claim 7, wherein the insulator layer has resistance switching properties dependent on at least one of a presence or distribution of various defects inside the insulator layer.

9. A memory cell as in claim 8, wherein the insulator layer has preformed defects.

10. A memory cell as in claim 7, wherein the insulator layer has resistance switching properties dependent on distribution of oxygen vacancies in the insulator layer.

11. A memory cell as in claim 1, wherein the first electrode is a reactive electrode.

12. A memory cell as in claim 11, further comprising a reactive interface between the reactive electrode and the second layer, wherein defects travel from the reactive electrode to the second layer by passing through the reactive interface.

13. A memory cell as in claim 11, further comprising a reactive interface between the reactive electrode and the second layer, wherein oxygen travels from the reactive electrode to the second layer by passing through the reactive interface.

14. A memory cell as in claim 1, wherein the first electrode is an inert electrode.

15. A memory cell as in claim 14, further comprising an inert interface between the inert electrode and the second layer, wherein the inert interface prevents a transfer of defects between the second layer and the inert electrode.

16. A memory cell as in claim 14, further comprising an inert interface between the inert electrode and the second layer, wherein the inert interface prevents oxygen transfer between the second layer and the inert electrode.

17. A memory cell as in claim 1, wherein the base portion operates to increase a formed barrier height at an interface between the first electrode and the second layer.

18. A memory cell as in claim 1, wherein the base portion operates to decrease a formed barrier height at an interface between the first electrode and the second layer.

19. A memory cell as in claim 1, wherein the first electrode is between about 5 and 500 nm.

20. A memory cell as in claim 1, wherein the first electrode operates as an adhesion layer.

* * * * *